(12) United States Patent
Bachmann

(10) Patent No.: US 10,931,084 B2
(45) Date of Patent: Feb. 23, 2021

(54) EDGE-EMITTING SEMICONDUCTOR LASER AND METHOD FOR OPERATING A SEMICONDUCTOR LASER

(71) Applicant: OSRAM Opto Semiconductors GmbH, Regensburg (DE)

(72) Inventor: Alexander Bachmann, Ismaning (DE)

(73) Assignee: OSRAM OLED GMBH, Regensburg (DE)

( * ) Notice: Subject to any disclaimer, the term of this patent is extended or adjusted under 35 U.S.C. 154(b) by 135 days.

(21) Appl. No.: 16/217,439

(22) Filed: Dec. 12, 2018

(65) Prior Publication Data

US 2019/0131773 A1    May 2, 2019

Related U.S. Application Data

(63) Continuation of application No. 15/628,406, filed on Jun. 20, 2017, now Pat. No. 10,177,533.

(30) Foreign Application Priority Data

Jun. 20, 2016  (DE) ...................... 10 2016 111 255.0

(51) Int. Cl.
  *H01S 5/34* (2006.01)
  *H01S 5/30* (2006.01)
  (Continued)

(52) U.S. Cl.
  CPC ............... *H01S 5/30* (2013.01); *H01S 5/20* (2013.01); *H01S 5/2004* (2013.01);
  (Continued)

(58) Field of Classification Search
  CPC ......................... H01S 5/3201; H01S 5/3403
  See application file for complete search history.

(56) References Cited

U.S. PATENT DOCUMENTS

| 4,663,761 A | 5/1987 | Barnard et al. |
| 5,561,680 A | 10/1996 | Haberern et al. |

(Continued)

FOREIGN PATENT DOCUMENTS

| DE | 102011055891 A1 | 6/2013 | |
| GB | 2020083 A * | 11/1979 | ......... G11B 3/08509 |

(Continued)

OTHER PUBLICATIONS

Buda, M. et al., "Stress-Induced Effects by the Anodic Oxide in Ridge Waveguide Laser Diodes," IEEE Journal of Quantum Electronics, vol. 36, No. 10, Oct. 2000, 10 pages.

(Continued)

*Primary Examiner* — Tod T Van Roy
(74) *Attorney, Agent, or Firm* — Slater Matsil, LLP

(57) ABSTRACT

An edge-emitting semiconductor laser and a method for operating a semiconductor laser are disclosed. The edge-emitting semiconductor laser includes an active zone within a semiconductor layer sequence and a stress layer. The active zone is configured for being energized only in a longitudinal strip perpendicular to a growth direction of the semiconductor layer sequence. The semiconductor layer sequence has a constant thickness throughout in the region of the longitudinal strip so that the semiconductor laser is gain-guided. The stress layer may locally stress the semiconductor layer sequence in a direction perpendicular to the longitudinal strip and in a direction perpendicular to the growth direction. A refractive index of the semiconductor layer sequence, in regions which, seen in plan view, are located next to the longitudinal strip, for the laser radiation generated during operation is reduced by at least $2\times10^{-4}$ and by at most $5\times10^{-3}$.

19 Claims, 5 Drawing Sheets

(51) Int. Cl.
*H01S 5/20* (2006.01)
*H01S 5/32* (2006.01)
*H01S 5/10* (2021.01)

(52) U.S. Cl.
CPC .......... *H01S 5/2036* (2013.01); *H01S 5/2054* (2013.01); *H01S 5/3201* (2013.01); *H01S 5/3403* (2013.01); *H01S 5/1064* (2013.01); *H01S 2301/17* (2013.01); *H01S 2301/176* (2013.01)

(56) References Cited

U.S. PATENT DOCUMENTS

| | | | |
|---|---|---|---|
| 7,509,006 | B2 | 3/2009 | Shiraishi |
| 7,778,298 | B2 | 8/2010 | Fujimoto |
| 9,722,394 | B2 | 8/2017 | Lauer et al. |
| 2003/0179795 | A1 | 9/2003 | Moriya et al. |
| 2010/0290496 | A1 | 11/2010 | Takayama et al. |
| 2011/0003403 | A1 | 1/2011 | Hiraiwa et al. |
| 2012/0082178 | A1 | 4/2012 | Tamanuki |
| 2014/0334508 | A1 | 11/2014 | Lauer et al. |

FOREIGN PATENT DOCUMENTS

| | | | |
|---|---|---|---|
| JP | H03076287 | A | 4/1991 |
| JP | H07263814 | A | 10/1995 |
| JP | H0936493 | A | 2/1997 |
| JP | H11220223 | A | 8/1999 |
| JP | 2002329926 | A | 11/2002 |
| JP | 2007293215 | A | 11/2007 |
| JP | 2008277492 | A | 11/2008 |
| JP | 2010123785 | A | 6/2010 |
| JP | 2010267731 | A | 11/2010 |
| JP | 2012119646 | A | 6/2012 |
| WO | 9750133 | A1 | 12/1997 |
| WO | 2006106886 | A1 | 10/2006 |
| WO | 2013079346 | A1 | 6/2013 |

OTHER PUBLICATIONS

Dente, G., "Low Confinement Factors for Suppressed Filaments in Semiconductor Lasers," IEEE Journal of Quantum Electronics, vol. 37, Issue 12, Dec. 2001, pp. 1650-1653.

Haag, M., et al., "Novel high-brightness fiber coupled diode laser device," High-Power Diode Laser Technology and Applications V, Proc. of SPIE, vol. 6456, Feb. 7, 2007, pp. 1-8.

Kirby, P.A. et al., "Photoelastic Waveguides and their Effect on Stripe-Geometry GaAs/Ga1—xAlxAs Lasers," Journal of Applied Physics, vol. 50, No. 7, 1979, 13 pages.

Liu, H.D. et al., "The Stresses and Photoelastic Effects in Stripe Geometry GaAs—GaAlAs DH Lasers with Masked and Selective Thermal Oxidation (MSTO) Structure," IEEE Journal of Quantum Electronics, vol. QE-19, No. 6, Jun. 1983, 5 pages.

Piprek, J., "Inverse Thermal Lens Effects on the Far-Field Blooming of Broad Area Laser Diodes," IEEE Photonics Technology Letters, vol. 25, No. 10, May 15, 2013, pp. 958-960.

Sun, W., et al., "Higher brightness laser diodes with smaller slow axis divergence," High-Power Diode Laser Technology and Applications XI, Proc. SPIE 8605, Feb. 26, 2013, pp. 1-9.

* cited by examiner

EDGE-EMITTING SEMICONDUCTOR LASER AND METHOD FOR OPERATING A SEMICONDUCTOR LASER

CROSS-REFERENCE TO RELATED APPLICATIONS

This is a continuation application of U.S. application Ser. No. 15/628,406, filed Jun. 20, 2017, which claims the benefit of German patent application 10 2016 111 255.0 filed on Jun. 20, 2016, which applications are hereby incorporated herein by reference.

TECHNICAL FIELD

An edge-emitting semiconductor laser is defined. Furthermore, a method for operating such a laser is defined.

BACKGROUND

A problem to be solved is to define an edge-emitting semiconductor laser which emits radiation with high efficiency into a specific region.

SUMMARY

Embodiments of the invention provide, inter alia, an edge-emitting semiconductor laser and a method for operating such a laser.

According to at least one embodiment, the semiconductor laser has an active zone within a semiconductor layer sequence. The active zone has a pn-junction and/or a single quantum well structure or a multiple quantum well structure. The semiconductor layer sequence is preferably based on a III-V compound semiconductor material. The semiconductor material is, for example, a nitride compound semiconductor material, such as $Al_nIn_{1-n-m}Ga_mN$, or a phosphide compound semiconductor material, such as $Al_nIn_{1-n-m}Ga_mP$, or an arsenide compound semiconductor material, such as $Al_nIn_{1-n-m}Ga_mAs$ or such as $Al_nGa_mIn_{1-n-m}As_kP_{1-k}$, where in each case $0 \leq n \leq 1$, $0 \leq m \leq 1$ and $n+m \leq 1$ and $0 \leq k < 1$. Preferably, in respect of at least one layer or in respect of all layers of the semiconductor layer sequence the following applies: $0 < n \leq 0.8$, $0.4 \leq m < 1$ and $n+m \leq 0.95$ and $0 < k \leq 0.5$. The semiconductor layer sequence can have dopants and also additional constituents. For the sake of simplicity, however, only the basic constituents of the crystal lattice of the semiconductor layer sequence, that is to say Al, As, Ga, In, N or P, are indicated, although they can to some extent be supplemented and/or replaced by small amounts of other substances. The semiconductor layer sequence is preferably based on the material system AlInGaAs.

According to at least one embodiment, the semiconductor laser is an edge-emitting laser. This means that guidance of a laser radiation in the laser and/or an emission direction of the laser is oriented perpendicular or substantially perpendicular to a growth direction of the semiconductor layer sequence. In particular, it is possible for laser radiation to be generated in the semiconductor laser only in a comparatively small region, seen in plan view onto the semiconductor layer sequence.

According to at least one embodiment, the semiconductor laser comprises one or more stress layers. The at least one stress layer is configured for achieving targeted material stress in the semiconductor layer sequence.

According to at least one embodiment, the active zone is configured for being energized solely in a longitudinal strip perpendicular to a growth direction of the semiconductor layer sequence. The longitudinal strip is defined, for example, by a metallization for an input of current into the active zone. The longitudinal strip is preferably congruent with a resonator for the laser radiation. The longitudinal strip and/or the resonator can run in a straight line or can also have bends or folds or be of trapezoidal or rectangular configuration.

To simplify the description it is assumed here and herein below that there is no appreciable current-spreading from the longitudinal strip towards the active zone in a direction perpendicular to the growth direction. This means especially that the energization of the active zone takes place mainly or predominantly below and/or congruent with the longitudinal strip. In particular, the laser radiation is generated predominantly in a region that is covered by the longitudinal strip. Predominantly can mean at least 50% or 80% or 90%.

According to at least one embodiment, the semiconductor layer sequence has a uniform, constant thickness throughout in the region of the longitudinal strip. "In the region of the longitudinal strip" can denote an area which, seen in plan view, is in total twice or four times or eight times or ten times as wide as the longitudinal strip and in which the longitudinal strip is centrally placed. In other words, the longitudinal strip is not defined by etching of the semiconductor layer sequence and/or by a reduction in the thickness of the semiconductor layer sequence.

According to at least one embodiment, the semiconductor laser is a gain-guided laser. That means that a resonator is defined not by a strip waveguide but by an energization region of the active zone.

According to at least one embodiment, as a result of the stress layer the semiconductor layer sequence is stressed, especially tensile-stressed, in a direction perpendicular to the longitudinal strip and in a direction perpendicular to the growth direction. The stress in the growth direction preferably acts exclusively or most predominantly solely on a region next to the longitudinal strip, seen in plan view. In other words, in the region of energization the active zone is preferably not stressed or not significantly stressed by the stress layer.

According to at least one embodiment, as a result of the stress layer a refractive index of the semiconductor layer sequence is reduced by at least $2 \times 10^{-4}$ or $5 \times 10^{-4}$ and/or by at most $5 \times 10^{-3}$ or $2 \times 10^{-3}$. This applies especially to a region which, seen in plan view, is located next to the longitudinal strip. In other words, as a result of the stress layer the region below the longitudinal strip in the semiconductor layer sequence has a slightly increased refractive index. Accordingly, as a result of the stress layer, slight index guidance of laser radiation generated during operation is obtained in the region of the longitudinal strip. By means of the stress layer, therefore, at least slight guidance of the laser radiation is achieved without any geometric modification of the semiconductor layer sequence per se.

In at least one embodiment, the edge-emitting semiconductor laser comprises an active zone within a semiconductor layer sequence and also a stress layer. The active zone is configured for being energized only in a longitudinal strip perpendicular to a growth direction of the semiconductor layer sequence. The semiconductor layer sequence is configured to have a constant thickness throughout in the region of the longitudinal strip, so that the semiconductor laser is gain-guided. As a result of the stress layer the semiconductor layer sequence is locally stressed, preferably tensile-stressed, in a direction perpendicular to the longitudinal strip and in a direction perpendicular to the growth direction.

Accordingly, a refractive index of the semiconductor layer sequence in regions which are located next to the longitudinal strip, seen in plan view, for the laser radiation generated during operation is reduced by least $2\times10^{-4}$ and by at most $5\times10^{-3}$. This results in index guidance of the laser radiation along the longitudinal strip.

High-power laser diodes, for example, for fiber coupling applications, such as semiconductor laser diodes which are used for pumping fiber lasers, are often limited not by the achievable optical output power and reliability but primarily by the beam quality and brilliance. That is to say, the optical output power must be emitted within a certain solid angle range in order that it can be coupled into an optical fiber. In order to increase the effective power in the fiber, the emission angle and the light-emitting surface on an outcoupling facet of the semiconductor laser must be reduced. In particular, a reduction in what is known as the beam parameter product, abbreviated to BPP, is desirable. The beam parameter product is defined as the product of the emission angle and the light-emitting surface.

In the case of conventional broad area lasers and edge emitters, a particular limiting factor is the beam quality in a direction parallel to the layer planes, that is to say in a direction perpendicular to the growth direction of the semiconductor layer sequence, also referred to as the slow axis. Particularly in the case of gain-guided lasers, the width of a light emission is not defined exactly by a patterned contact width, but is also defined, for example, by thermal effects and by current-spreading effects. As a rule, the width of the light-emitting surface is accordingly greater than a contact width of electrical contacts per se, because charge carries are able to diffuse laterally. That greater width is troublesome in some applications, because on the one hand the beam parameter product is increased and on the other hand a width of the light-emitting surface is not stable, for example, in the event of an increase in an electrical pump current.

Although it is possible to achieve optical index guidance, and thus stabilize the width of the light emission, by etching the semiconductor layer sequence outside the contact strip, this results in an undesirable increase in the emission angle. In the case of the semiconductor laser described herein, the undesired increase in the width of the light emission is avoided by the stress layer, which induces targeted stress without etching of the semiconductor layer sequence.

In the case of the semiconductor laser described herein, as a result of the stress layer the semiconductor layer sequence is subjected to targeted stress so that refractive index gradients are formed which result in a kind of waveguide having slight index guidance, without it being necessary to etch the semiconductor layer sequence. Accordingly, relatively strong lateral guidance of an electro-optical field in the semiconductor laser can be achieved, so that a light emission surface is more strongly delimited laterally. This results in a relatively narrow light emission surface at the outcoupling facet and, in the case of identical contact surfaces, in an improved beam quality, especially a reduced beam parameter product.

According to at least one embodiment, the stress, especially the tensile stress, induced in the semiconductor layer sequence by the stress layer is at least 50 MPa or 100 MPa or 200 MPa. Alternatively or in addition, the stress is at most 1 GPa or 0.5 GPa or 0.3 GPa. This applies especially in the region next to the longitudinal strip, seen in plan view.

According to at least one embodiment, a spacing between the stress layer and the active zone in a direction longitudinal with respect to the growth direction is at least 0.1 µm or 0.5 µm or 1 µm. Alternatively or in addition, that spacing is at most 10 µm or 5 µm or 3 µm or 2 µm or 1.5 µm. In other words, the stress layer is located relatively close to the active zone.

According to at least one embodiment, a lateral spacing of the stress layer from the energized region varies between the two facets. For example, the spacing is smaller at an outcoupling facet than at a back facet or vice versa.

According to at least one embodiment, the longitudinal strip is itself free of the stress layer. In other words, the stress layer has been applied in a pattern, especially only in regions in which no input of current into the semiconductor layer sequence takes place.

According to at least one embodiment, a thickness of the stress layer is at least 40 nm or 70 nm or 100 nm. Alternatively or in addition, the stress layer has a thickness of at most 0.5 µm or 0.3 µm or 0.15 µm.

According to at least one embodiment, the stress layer has in the regions in which it has been applied a uniform, constant and/or unvarying thickness. Departing therefrom, it is possible for the stress layer to be applied with a thickness gradient. For example, a thickness of the stress layer can increase from the outside in a direction towards the longitudinal strip. Alternatively or in addition, the thickness of the stress layer can increase or, less preferably, also decrease from the back facet towards the outcoupling facet.

According to at least one embodiment, at least one passivation layer is located between the stress layer and the semiconductor layer sequence. Accordingly it is possible for the stress layer not to touch the semiconductor layer sequence. The passivation layer is preferably electrically insulating. Furthermore, the passivation layer can be of uniform thickness in the regions in which it has been applied.

According to at least one embodiment, the stress layer is located directly on the semiconductor layer sequence. The stress layer can have been applied directly to the semiconductor layer sequence in places or over the whole surface.

According to at least one embodiment, the stress layer forms a part of the semiconductor layer sequence. For example, the stress layer has been created with a defined lattice mismatch within or at an outer layer of the semiconductor layer sequence. The stress layer preferably follows after the active zone along the growth direction, but can alternatively also be located before the active zone along the growth direction.

According to at least one embodiment, the stress layer is composed of a plurality of sublayers. Sublayers of different classes of material can be combined with one another, for example, dielectric materials with metallic materials. The sublayers preferably follow immediately one after the other and are arranged stacked directly one above the other. The sublayers can be applied congruently with one another or can be displaced laterally and/or be of different sizes, seen in plan view.

According to at least one embodiment, the semiconductor laser includes a plurality of stress layers. The stress layers can be separated from one another by further layers, so that the stress layers do not touch one another. Seen in plan view, the stress layers can partly or completely overlap one another or can be arranged completely next to one another. The stress layers can be applied or accommodated in functionally different regions, for example, in the region of passivation layers, electrical contact layers or electrical contact structures and/or in the region of current-spreading layers or conductor tracks.

According to at least one embodiment, the semiconductor laser includes an electrical contact structure. The contact structure is preferably located on a side of the semiconductor layer sequence that follows after the active zone along the growth direction. The electrical contact structure is preferably formed from one or more metal layers. Alternatively or in addition, the contact structure can comprise one or more electrically conducting layers of a non-metallic, electrically conducting material, especially of a transparent conductive oxide such as ITO.

According to at least one embodiment, the stress layer is electrically conducting. In that case the stress layer is preferably formed from a metal, a metal alloy, a transparent conductive oxide or a semiconductor material.

According to at least one embodiment, the stress layer comprises or consists of one or more metal oxides. The metal oxide can be electrically insulating or electrically conducting. For example, the metal oxide is aluminum oxide, titanium dioxide, zinc oxide, zirconium oxide and/or hafnium oxide.

According to at least one embodiment, the stress layer has been grown partly or completely epitaxially. In that case the stress layer is preferably formed from one or more semiconductor materials or comprises one or more semiconductor materials.

According to at least one embodiment, the stress layer is formed from one or more dielectric nitrides and/or oxides or comprises one or more such nitrides or oxides. For example, the material for the stress layer is aluminum oxide, aluminum nitride, silicon oxide, silicon oxynitride or silicon nitride.

According to at least one embodiment, the stress layer is formed from one or more organic materials or comprises one or more organic materials. Examples of such organic materials are polyimides or benzocyclobutene, abbreviated to BCB.

According to at least one embodiment, the stress layer has a roughened surface, preferably on a side facing towards the semiconductor layer sequence. The roughened surface especially has the effect of creating a mechanical interlocking engagement of the stress layer with a material abutting the stress layer, for example, in a direction towards the semiconductor layer sequence. By virtue of the roughened surface, adhesion of the stress layer to that abutting material can be enhanced as a result of the geometric structuring.

According to at least one embodiment, the roughened surface has a mean roughness of at least 20 nm or 40 nm. Alternatively or in addition, the mean roughness is at most 200 nm or 100 nm or 50 nm. In particular, the mean roughness is at most $\lambda/n$ or $\lambda/2n$ or $\lambda/4n$, where $\lambda$ denotes a wavelength of maximum intensity of the laser radiation and n denotes a mean refractive index of the material abutting the stress layer and/or of the material of the stress layer.

According to at least one embodiment, the reduction in the refractive index brought about by the stress layer is concentrated in a narrow region especially next to the longitudinal strip. That means that, for example, at least 50% or 70% or 90% of the change in the refractive index takes place in a region having a width that is at most 30% or 50% or 70% of a mean width of the longitudinal strip. In other words, a relative sharp jump in the refractive index is achieved by the stress layer. It is possible for the refractive index otherwise not to undergo a gradual change or any significant gradual change as a result of the stress layer. That is to say, in other regions which are located especially directly below the longitudinal strip or further away from the longitudinal strip, the refractive index can be constant or approximately constant.

According to at least one embodiment, trenches are formed in the semiconductor layer sequence parallel to the longitudinal strip and preferably on both sides of the longitudinal strip. The trenches preferably have oblique side faces. This means that the side faces of the trenches are then not oriented parallel to the growth direction. An angle of the side faces with respect to the growth direction is preferably at least 10° or 15° or 30° and/or at most 60° or 45° or 35°.

According to at least one embodiment, a spacing between the longitudinal strip and the trenches is in each case at least 10 μm or 15 μm or 20 μm and/or at most 200 μm or 100 μm or 50 μm. In particular, the trenches are sufficiently far from the longitudinal strip that at the side faces the laser radiation has no intensity or no significant intensity during operation as intended. This means, for example, that the trenches and their side faces are not configured for guidance of the laser radiation in a direction parallel to the longitudinal strip and do not contribute, or do not contribute significantly, to radiation guidance parallel to the longitudinal strip.

According to at least one embodiment, the stress layer has a preferably monotonically or strictly monotonically increasing or decreasing width in a direction towards an outcoupling side of the laser radiation, seen in plan view. If the stress layer is formed from a single strip of material, the width of the stress layer preferably decreases towards the outcoupling side. If the stress layer is formed from two strips of material, the width of the stress layer preferably increases towards the outcoupling side, that is to say a spacing between the strips of material becomes smaller.

Furthermore, a method for operating a semiconductor laser is defined. The semiconductor laser is constructed as indicated in connection with one or more of the above-mentioned embodiments. Features of the method are therefore disclosed also for the semiconductor laser and vice versa.

In at least one embodiment of the method, the stress in the semiconductor layer sequence as a result of the stress layer occurs to a significant extent only during operation of the semiconductor laser at or approaching an intended operating temperature. This can mean that particularly at room temperature, that is to say about 23° C., the stress layer does not give rise to any stress, or any significant stress, in the semiconductor layer sequence. For example, the stress in the semiconductor layer sequence occurs as a result of different thermal expansion coefficients of the stress layer and the semiconductor layer sequence. The intended operating temperature is, for example, at least 30° C. or 40° C. or 50° C. and/or at most 150° C. or 130° C. or 100° C. The operating temperature relates especially to a temperature of the semiconductor laser in or close to the semiconductor layer sequence that is stationary during operation.

Alternatively it is possible for the stress induced in the semiconductor layer sequence by the stress layer to be permanently present, substantially independently of the temperature of the semiconductor laser. In particular, in the last-mentioned case the stress induced in the semiconductor layer sequence by the stress layer can be induced by the at least one material of the stress layer and/or by the conditions during creation of the stress layer on the semiconductor layer sequence.

BRIEF DESCRIPTION OF THE DRAWINGS

A semiconductor laser described herein is elucidated in detail below on the basis of exemplified embodiments and with reference to the drawing. In the individual Figures, elements that are identical are denoted by identical reference In the drawings.

DETAILED DESCRIPTION OF ILLUSTRATIVE EMBODIMENTS

Figure 1A:
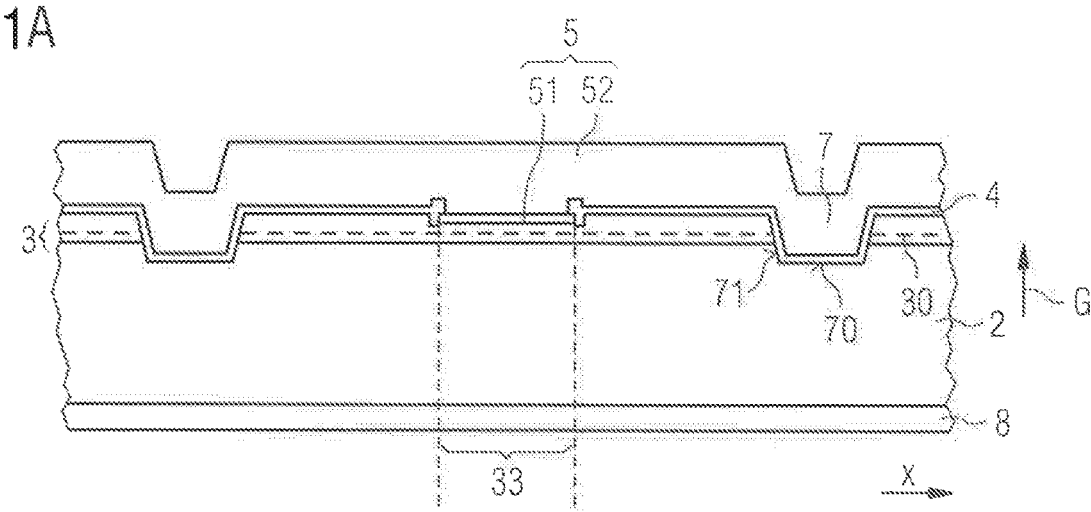
FIGS. 1A-1C show a diagrammatic sectional view of an arrangement of a semiconductor laser as well as diagrammatic representations of the optical properties of such a semiconductor laser.

FIG. 1A shows an arrangement of an edge-emitting semiconductor laser. The semiconductor laser has a semiconductor layer sequence 3 having an active zone 30. The semiconductor layer sequence 3 is located on a substrate 2 to which an electrical contact layer 8 has been applied. On a side of the semiconductor layer sequence 3 remote from the substrate 2 there are located an electrically insulating passivation layer 4 and an electrical contact structure 5. The electrical contact structure 5 has a first sublayer 51 directly on the semiconductor layer sequence 3 and a planar second sublayer 52. A longitudinal strip 33 is defined by means of the first sublayer 51 and the passivation layer 4. In approximate terms, the active zone 30 is energized only in the longitudinal strip 33 or in an x-direction over a very small width beyond the longitudinal strip 33. Laser radiation L is therefore generated substantially only in the region of the longitudinal strip 33.

Furthermore, trenches 7 are present which are spaced a relatively large distance apart from the longitudinal strip 33. The trenches 7 each have a base surface 70 which faces towards the electrical contact layer 8. Obliquely extending side faces 71 face towards the longitudinal strip 33. In a direction parallel to a growth direction G of the semiconductor layer sequence 3, the trenches 7 can extend into the substrate 2. In the region of the longitudinal strip 33 neither the semiconductor layer sequence 3 nor the substrate 2 is patterned.

Figure 1B:
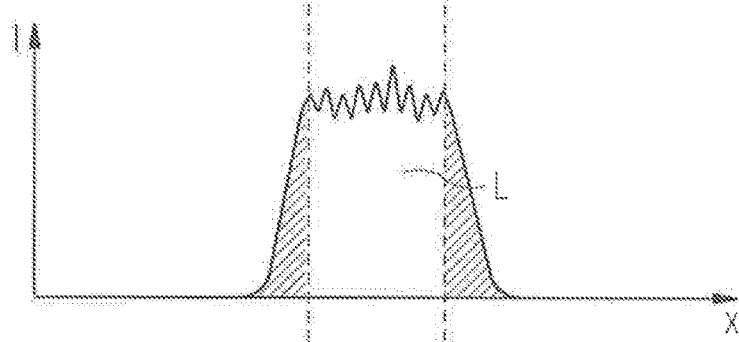

FIG. 1B illustrates a profile of an intensity I of an emitted laser radiation L along the x-direction. On the one hand, in the region of the longitudinal strip 33 the intensity I has been modulated. On the other hand, a significant proportion of the intensity is also emitted outside the longitudinal strip 33. Accordingly, the laser radiation L is significantly more widespread relative to the longitudinal strip 33. The laser radiation L is therefore emitted with a comparatively poor beam parameter product.

Figure 1C:
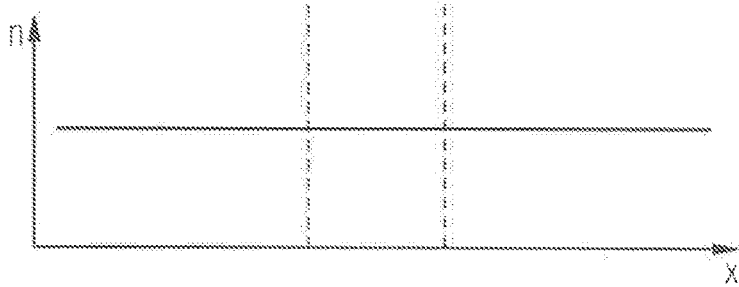

Finally, FIG. 1C shows a profile of the refractive index n along the x-direction. The refractive index n especially of the active zone 30 is constant in the entire region at and around the longitudinal strip 33. Thermal effects have not been considered in detail in FIG. 1C. In particular, the fact that the refractive index profile can have been modified by a lateral temperature gradient has not been taken into account.

Figure 2A:
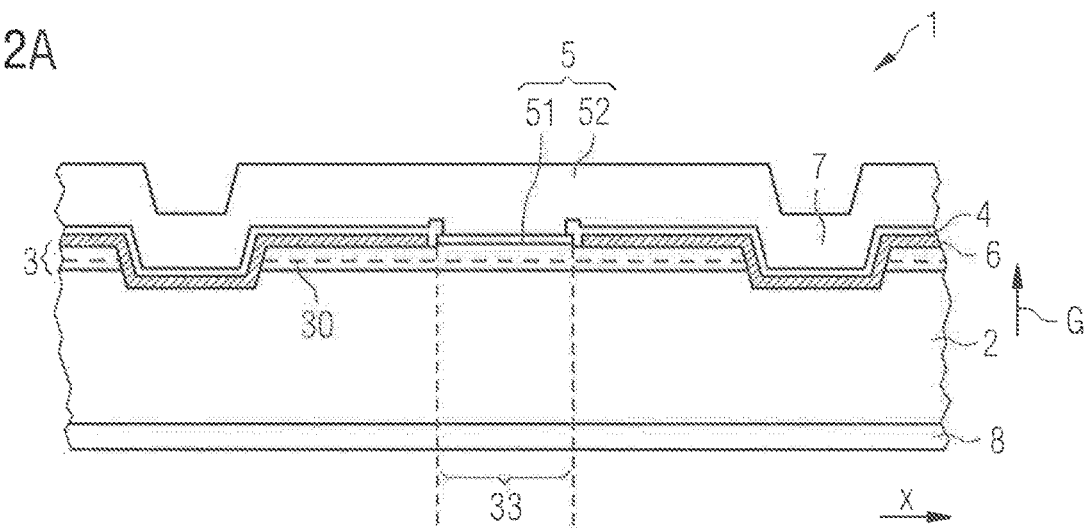
FIGS. 2A-2C and 4-8 show diagrammatic sectional views of semiconductor lasers described herein as well as diagrammatic representations of the optical properties.

FIG. 2A shows, in illustrations analogous to —, an exemplified embodiment of an edge-emitting semiconductor laser 1. The semiconductor laser 1 has, in addition, a stress layer 6. The stress layer 6, which has been applied throughout except for the longitudinal strip 33, is located directly on the semiconductor layer sequence 3 and optionally in the region of the trenches 7 also directly on the substrate 2. The stress layer 6 is completely separated from the electrical contact structure 5 by the passivation layer 4. The stress layer 6 is formed, for example, by a titanium dioxide layer having a thickness of approximately 100 nm.

Figure 2B:
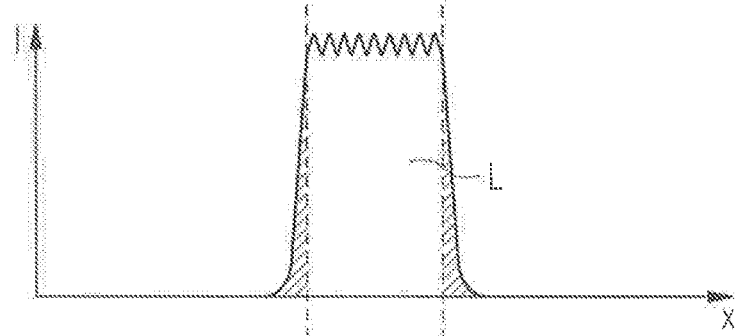
Figure 2C:
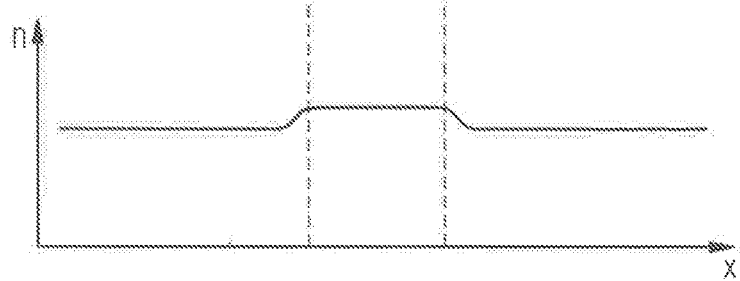

As a result of the stress layer 6, an increased refractive index is achieved in the region of the longitudinal strip 33, see FIG. 2C. At the edges of the longitudinal strip 33 the refractive index n falls comparatively sharply to a lower value which is present in other regions outside the longitudinal strip 33. The fall in the refractive index commences at the point where the stress layer 6 begins, preferably with a tolerance of at most 25% or 10% or 5% of the width of the longitudinal strip 33 along the x-direction.

Such an increased refractive index n in the region of the longitudinal strip 33 results in index guidance of the laser radiation L, so that the laser radiation L is emitted in a region that is better defined and narrower along the x-direction, see FIG. 2B. Accordingly, a smaller beam parameter product is achieved.

The exemplified embodiment of FIG. 2A otherwise corresponds to the arrangement shown in FIG. 1A. The trenches 7 are optional, as are the electrical contact layer 8 over the whole area and the multi-layered construction of the electrical contact structure 5.

Possible alternative ways of reducing a width of the light emission of the laser radiation L lie in selecting narrower contact strips in the form of the longitudinal strips 33. However, this is associated in particular with a light emission width that is not current-independent and, usually, with an increase in beam divergence. Furthermore, current density and power density are increased, which can result in reduced component reliability. It is also possible to etch the semiconductor layer sequence so as to obtain stronger index guidance by a ridge waveguide. A narrower light emission width in the x-direction is achieved as a result, but on the other hand this leads to increased beam divergence and therefore to adverse effects on the beam parameter product.

Figure 3:
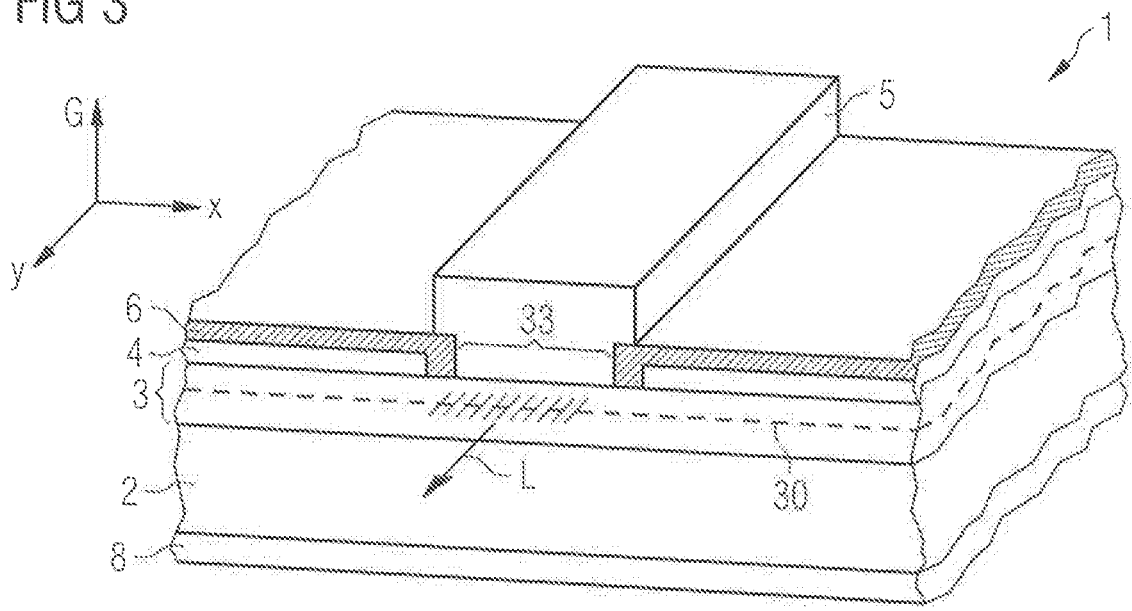
FIG. 3 shows a diagrammatic perspective view of a semiconductor laser described herein.

In the exemplified embodiment of FIG. 3 it can be seen that the longitudinal strip 33 extends along a y-direction that is oriented perpendicular to the x-direction and perpendicular to the growth direction G. A region of an emission surface of the laser radiation L is indicated by hatching.

Departing from FIG. 2A, the stress layer 6 according to FIG. 3 is located on a side of the passivation layer 4 remote from the semiconductor layer sequence 3. Optionally it is possible for the stress layer 6 close to the electrical contact structure 5 to extend as far as the semiconductor layer sequence 3. The electrical contact structure 5 partly covers the stress layer 6 and is T-shaped seen in cross-section.

Departing from the illustration in FIG. 3, the electrical contact structure 5 can be configured as in FIG. 2A, as is also possible in all other exemplified embodiments. In particular, a second sublayer 52 can be present which completely or substantially completely covers the stress layer 6. Furthermore, trenches 7 are preferably present, especially as illustrated in FIG. 2A.

Figure 4:
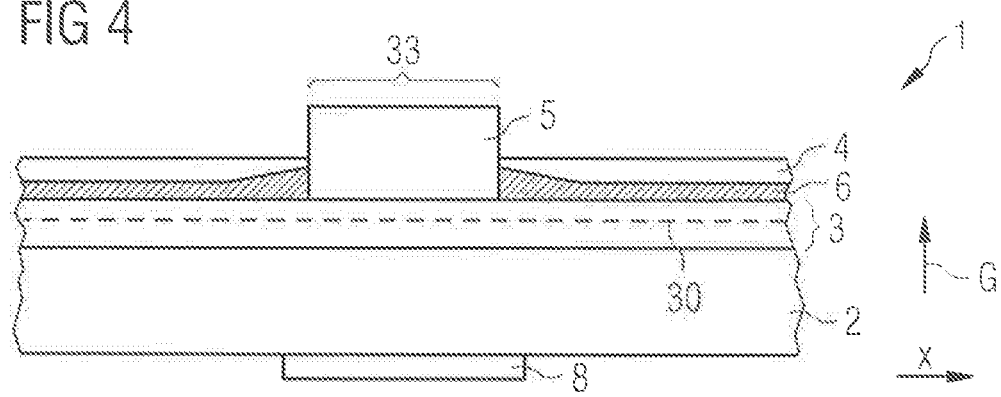

In the exemplified embodiment of FIG. 4 the stress layer 6 increases in thickness in a direction towards the electrical contact structure 5. The increase in the thickness of the stress layer 6 is preferably configured so as to be symmetrical with respect to the longitudinal strip 33. The contact structure 5, the passivation layer 4 and the stress layer 6 can terminate flush with one another. Optionally the contact layer 8 is applied only in regions on the side of the substrate 2 remote from the semiconductor layer sequence 3.

Figure 5:
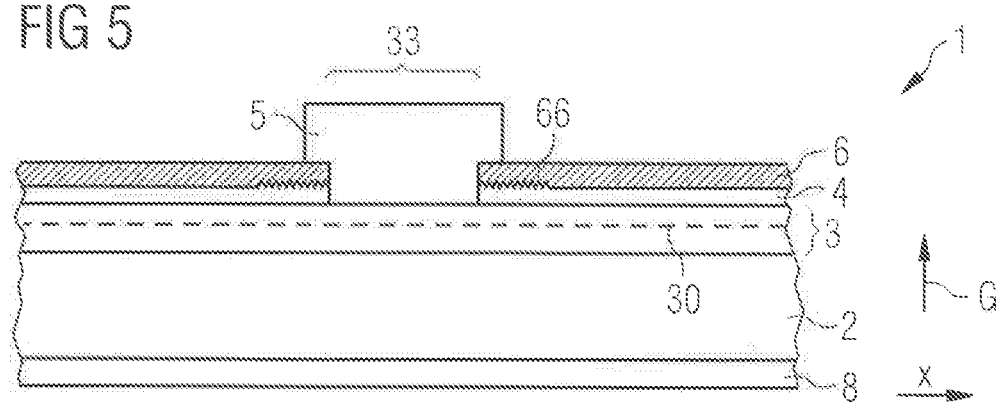

In the exemplified embodiment of the semiconductor laser 1 as illustrated in FIG. 5, the stress layer 6 has a roughened surface 66. According to FIG. 5, the roughened surface 66 is located between the stress layer 6 and the passivation layer 4.

Such variations in the thickness of the stress layer 6, see FIG. 4, and such roughened surfaces 66, see FIG. 5, can also be present in the other exemplified embodiments. The relative positions of the stress layer 6 and the passivation layer 4 can be interchanged in each case. Furthermore, it is also possible to combine variations in thickness and roughened surfaces 66 with one another in a single exemplified embodiment. Departing from the illustration in FIG. 5, the roughened surface 66 can also have been created directly on the semiconductor layer sequence.

Figure 6:
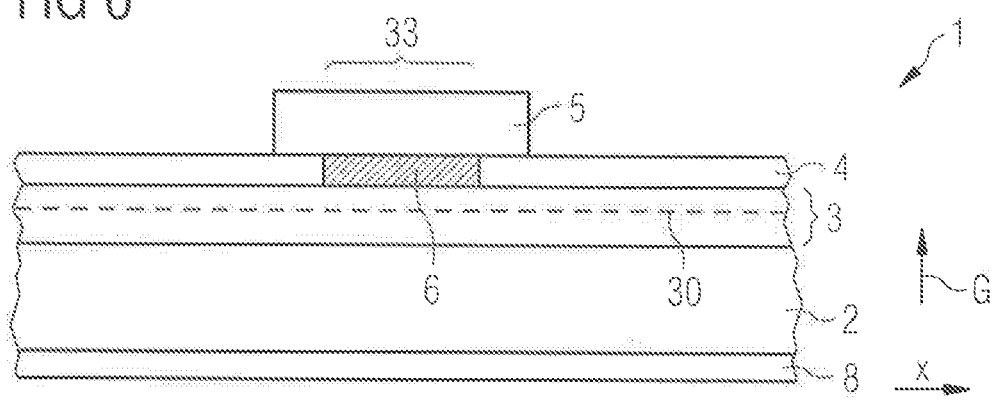

In the exemplified embodiment of FIG. 6 the stress layer 6 is located directly on the semiconductor layer sequence 3 and serves to define the longitudinal strip 33. The stress layer 6 is formed, for example, by a metal such as gold or titanium, as is also possible in all other exemplified embodiments. Accordingly, the stress layer 6 can be electrically conducting and also constitute a part of the electrical contact structure 5.

The passivation layer 4 and the stress layer 6 can be of the same thickness or, unlike what is shown in FIG. 6, of different thicknesses from one another. In particular, the stress layer 6 can be thicker than the passivation layer 4 and optionally cover the passivation layer 4 in places. Conversely, the passivation layer 4 can be thicker than the stress layer 6 and/or the stress layer 6 is partly covered by the passivation layer 4.

Figure 7:
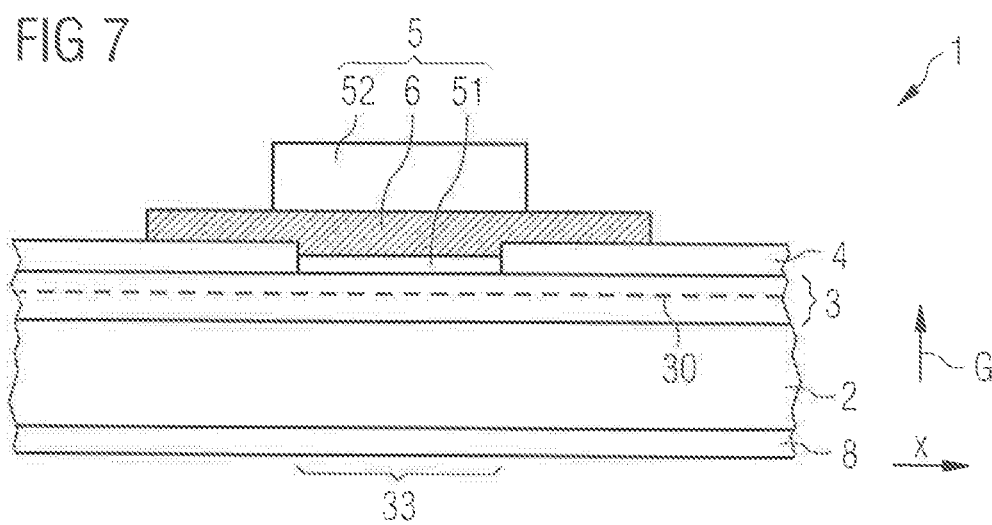

In the exemplified embodiment as illustrated in FIG. 7 the stress layer 6 is in the form of a sublayer of the electrical contact structure 5. The stress layer 6 can have been applied to larger regions of the semiconductor layer sequence 3 than the remaining sublayers 51 and/or 52 of the contact structure 5.

Figure 8:
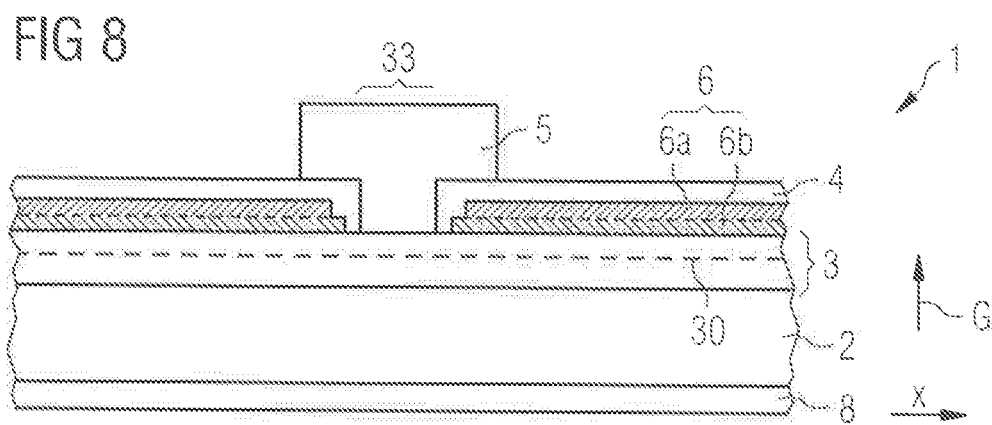

The exemplified embodiment of FIG. 8 illustrates that the stress layer 6 is composed of the sublayers 6a, 6b. The sublayers 6a, 6b are preferably made of different materials from one another, for example, of a semiconductor material in combination with a metal or of a metal in combination with a dielectric material or with a metal oxide. The sublayers 6a, 6b can have different base surfaces from one another, seen in plan view. Departing from FIG. 8, it is possible for the sublayers 6a, 6b to be arranged congruently with one another.

Furthermore, it is possible, for example, for the stress layers 6 of the exemplified embodiments of FIG. 2 to 5 or 8 to be combined with the stress layers 6 from the exemplified embodiments of FIG. 6 or 7. Accordingly, there can be a plurality of stress layers 6 in a single semiconductor laser 1.

The modification of the refractive index n by the stress layer 6 can be demonstrated, for example, by microphotoluminescence measurements on a facet of the semiconductor lasers 1. Microphotoluminescence makes it possible to determine distortions in a crystal lattice which are associated with the different refractive index n.

Figure 9:
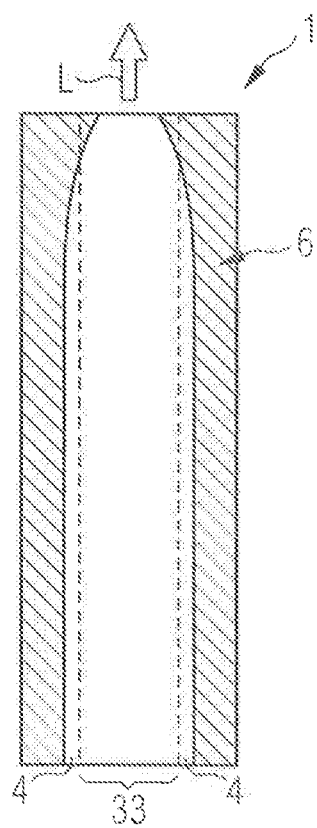
FIGS. 9 and 10 show diagrammatic plan views of semiconductor lasers described herein.
Figure 10:
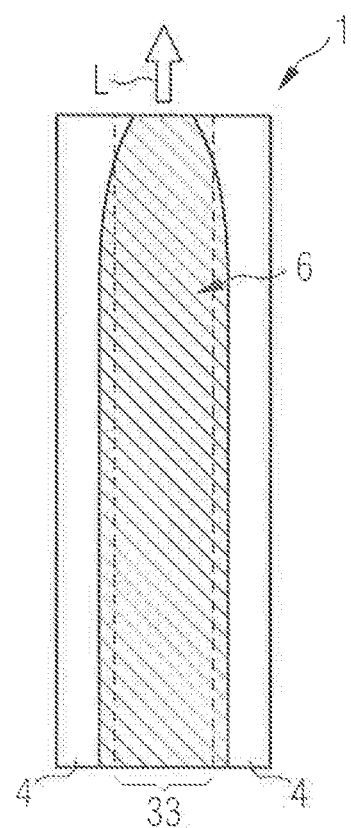

FIGS. 9 and 10 show plan views onto further exemplified embodiments of the semiconductor laser 1. The stress layer 6 is in each case matched to the width of the light field in the resonator. In particular, on account of a thermal lens effect, an effective width of the stress layer 6 is smaller at an outcoupling side. The stress layer 6 can partly overlap the longitudinal strip 33, seen in plan view. Such overlapping is possible, for example, as a result of the stress layer 6 being electrically conducting and/or as a result of the stress layer 6 being located in regions between the sublayers 51, 52 of the electrical contact structure 5.

According to FIG. 9, the stress layer 6 is located for the most part next to the longitudinal strip 33. A spacing between the two strips of material from which the stress layer 6 is composed becomes smaller only directly at and close to the outcoupling side, so that a spacing between the strips of material is at its smallest directly at the outcoupling side. Departing from the illustration in FIG. 9, it is possible for the strips of material not to overlap the longitudinal strip but to be placed completely next to the longitudinal strip 33.

The region in which the strips of material of the stress layer 6 overlap the longitudinal strip 33 and/or in which their spacing from one another becomes smaller has an extent, from the outcoupling side, of, for example, at least 2 μm or 10 μm or 50 μm and/or of at most 200 μm or 100 μm or 40 μm. A mean spacing between the material strips and the longitudinal strip in the larger, non-overlapping subarea is, for example, at least 1 μm or 5 μm or 20 μm and/or at most 100 μm or 30 μm or 5 μm. The spacing between the strips of material close to the outcoupling side runs especially in accordance with a quadratic root function.

In FIG. 10 the stress layer 6 is formed by a single strip of material. In comparison with FIG. 9, the strip of material in FIG. 10 is in the form of a negative. Taking this into account, the explanatory remarks made in relation to the stress layer 6 in connection with FIG. 9 apply analogously to FIG. 10.

The description of the invention described herein with reference to the exemplified embodiments does not limit the invention thereto; rather, the invention encompasses any novel feature and any combination of features, including in particular any combination of features in the patent claims, even if that feature or that combination is not itself explicitly defined in the patent claims or exemplified embodiments.

What is claimed is:

1. An edge-emitting semiconductor laser comprising:
   an active zone within a semiconductor layer sequence; and
   a stress layer;
   wherein the active zone is configured to be energized only in a longitudinal strip perpendicular to a growth direction of the semiconductor layer sequence,
   wherein the semiconductor layer sequence has a constant thickness throughout in a region of the longitudinal strip so that the semiconductor laser is gain-guided so that a resonator is defined by an energization region of the active zone, and wherein the resonator is free from being defined by a strip waveguide;
   wherein a spacing between the stress layer and the active zone, in a direction parallel to the growth direction, is at most 5 μm;
   wherein the longitudinal strip is free of the stress layer and the stress layer is disposed only in regions in which no input of current into the semiconductor layer sequence takes place;
   wherein, as a result of the stress layer, the semiconductor layer sequence is mechanically stressed in a direction perpendicular to the longitudinal strip and in a direction perpendicular to the growth direction so that a refractive index next to the longitudinal strip, seen in plan view, for laser radiation generated during operation is reduced by at least $2 \times 10^{-4}$ and by at most $5 \times 10^{-3}$ thereby obtaining index guidance of the laser radiation; and wherein the edge-emitting semiconductor laser comprises an electrical contact structure that energizes the longitudinal strip, wherein the electrical contact structure partly covers the stress layer and has a T-shaped cross-section.

2. The semiconductor laser according to claim 1, wherein tensile stress induced by the stress layer is at least 50 MPa and at most 0.5 GPa, and wherein a spacing between the stress layer and the active zone in a direction parallel to the growth direction is at least 0.1 µm.

3. The semiconductor laser according to claim 1, wherein the longitudinal strip is free of the stress layer, and wherein a thickness of the stress layer is between 40 nm and 0.3 µm inclusive and the thickness of the stress layer does not vary.

4. The semiconductor laser according to claim 1, wherein at least one passivation layer is located between the stress layer and the semiconductor layer sequence so that the stress layer does not touch the semiconductor layer sequence.

5. The semiconductor laser according to claim 1, wherein the stress layer is located directly on the semiconductor layer sequence.

6. The semiconductor laser according to claim 1, wherein the stress layer is composed of a plurality of sublayers.

7. The semiconductor laser according to claim 1, further comprising an electrical contact structure, wherein the stress layer is different from the electrical contact structure, and wherein the stress layer is electrically conducting.

8. The semiconductor laser according to claim 1, wherein the stress layer essentially consists of a metal oxide.

9. The semiconductor laser according to claim 8, wherein the stress layer is made of $TiO_2$.

10. The semiconductor laser according to claim 1, wherein the stress layer essentially consists of a semiconductor material, and wherein the stress layer is at least partially grown epitaxially.

11. The semiconductor laser according to claim 1, wherein the stress layer essentially consists of a dielectric nitride or oxide.

12. The semiconductor laser according claim 1, wherein the stress layer has a roughened surface on a side facing towards the semiconductor layer sequence so that by the roughened surface an interlocking engagement with a material abutting the stress layer in a direction towards the semiconductor layer sequence is created, and adhesion of the stress layer to that material is geometrically enhanced.

13. The semiconductor laser according to claim 1, wherein a reduction in the refractive index brought about by the stress layer takes place on both sides of the longitudinal strip across a region having in each case a width of at most 30% of a width of the longitudinal strip, and wherein the refractive index is otherwise constant.

14. The semiconductor laser according to claim 1, wherein trenches having oblique side faces are formed in the semiconductor layer sequence parallel to the longitudinal strip and on both sides of the longitudinal strip, and wherein a spacing between the longitudinal strip and the trenches is in each case at least 20 µm and the trenches do not contribute to a guidance of the laser radiation in a direction parallel to the longitudinal strip.

15. The semiconductor laser according to claim 1, wherein the stress layer is applied with a thickness gradient so that a thickness of the stress layer increases from the outside in the direction towards the longitudinal strip, seen in cross-section perpendicular to the longitudinal strip.

16. The semiconductor laser according to claim 1, wherein the stress layer has a constantly increasing or a constantly decreasing width in a direction towards an out-coupling side of the laser radiation.

17. A method comprising:
operating the edge-emitting semiconductor laser according to claim 1, wherein a tensile stress in the semiconductor layer sequence as a result of the stress layer occurs only during operation of the semiconductor laser on approaching an operating temperature.

18. The semiconductor laser according to claim 1, wherein the stress layer is located on a side of a passivation layer remote from the semiconductor layer sequence, and wherein the stress layer directly adjoins the semiconductor layer sequence in regions.

19. An edge-emitting semiconductor laser comprising:
an active zone within a semiconductor layer sequence; and
a stress layer;
wherein the active zone is configured for being energized only in a longitudinal strip perpendicular to a growth direction of the semiconductor layer sequence,
wherein the semiconductor layer sequence has, in a region of the longitudinal strip, a constant thickness throughout so that the semiconductor laser is gain-guided,
wherein, as a result of the stress layer, the semiconductor layer sequence is mechanically stressed in a direction perpendicular to the longitudinal strip and in a direction perpendicular to the growth direction, so that a refractive index next to the longitudinal strip, seen in plan view, for laser radiation generated during operation is reduced by at least $2\times10^{-4}$ and by at most $5\times10^{-3}$, and accordingly index guidance of the laser radiation is obtained;
wherein the stress layer is located on a side of a passivation layer remote from the semiconductor layer sequence;
wherein the stress layer extends, in a region close to an electrical contact structure which energizes the longitudinal strip, as far as the semiconductor layer sequence so that the electrical contact structure partly covers the stress layer and has a T-shaped cross-section;
wherein a thickness of the stress layer is at least 100 nm and the stress layer is at at least one of aluminum oxide, titanium dioxide, zinc oxide, zirconium oxide or hafnium oxide; and
wherein a spacing between the stress layer and the active zone along the growth direction is at least 0.1 µm and at most 5 µm.

* * * * *